US012033834B2

(12) United States Patent
Sawachi (10) Patent No.: US 12,033,834 B2
(45) Date of Patent: Jul. 9, 2024

(54) FLOW RATE CONTROLLER, GAS SUPPLY SYSTEM, AND FLOW RATE CONTROL METHOD

(71) Applicant: TOKYO ELECTRON LIMITED, Tokyo (JP)

(72) Inventor: Atsushi Sawachi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 319 days.

(21) Appl. No.: 16/979,812

(22) PCT Filed: Jun. 26, 2019

(86) PCT No.: PCT/JP2019/025367
§ 371 (c)(1),
(2) Date: Sep. 10, 2020

(87) PCT Pub. No.: WO2020/008975
PCT Pub. Date: Jan. 9, 2020

(65) Prior Publication Data
US 2021/0111004 A1 Apr. 15, 2021

(30) Foreign Application Priority Data

Jul. 2, 2018 (JP) .................... 2018-126105
Jun. 5, 2019 (JP) .................... 2019-104938

(51) Int. Cl.
*H01J 37/32* (2006.01)
*H01L 21/3065* (2006.01)
*H01L 21/67* (2006.01)

(52) U.S. Cl.
CPC .. *H01J 37/32449* (2013.01); *H01J 37/32091* (2013.01); *H01L 21/3065* (2013.01); *H01L 21/67069* (2013.01)

(58) Field of Classification Search
USPC ................................. 156/345.29
See application file for complete search history.

(56) References Cited

U.S. PATENT DOCUMENTS

| 5,865,205 A | * | 2/1999 | Wilmer | ............... G05D 7/0635 73/1.16 |
| 2009/0125154 A1 | * | 5/2009 | Yli-Koski | ............. G05D 7/0635 700/282 |
| 2016/0370810 A1 | * | 12/2016 | Satake | ............. H01L 21/67253 |

FOREIGN PATENT DOCUMENTS

| JP | H11-351204 A | 12/1999 |
| JP | 2004-178478 A | 6/2004 |

(Continued)

OTHER PUBLICATIONS

International Search Report for PCT/JP2019/025367 (English translation) dated Sep. 10, 2019, 2 pages.

*Primary Examiner* — Ram N Kackar
(74) *Attorney, Agent, or Firm* — XSENSUS LLP (57) ABSTRACT

A flow rate controller includes a valve and a valve control unit. The valve is configured to control a flow rate of a gas supplied to a processing device. The valve control unit is configured to open the valve to start a control of the flow rate of the gas when the processing device has issued a command that instructs a start of supplying gas; calculate a cumulative flow amount by integrating the flow rate of the gas at every predetermined cycle from a time point at which the command is issued; and close the valve to stop the control of the flow rate of the gas at a time point at which the calculated cumulative flow amount has reached a predetermined target cumulative flow amount.

4 Claims, 5 Drawing Sheets

(56) References Cited

FOREIGN PATENT DOCUMENTS

| | | | |
|---|---|---|---|
| JP | 2007-306992 | A | 11/2007 |
| JP | 2009-94425 | A | 4/2009 |
| JP | 2009-157578 | A | 7/2009 |
| JP | 2017-185883 | A | 10/2017 |

* cited by examiner

FLOW RATE CONTROLLER, GAS SUPPLY SYSTEM, AND FLOW RATE CONTROL METHOD

CROSS REFERENCE TO RELATED APPLICATIONS

This application is a national phase of PCT application No. PCT/JP2019/025367, filed on 26 Jun. 2019, which claims priority from Japanese Patent Application No. 2018-126105, filed on 2 Jul. 2018, and Japanese Patent Application No. 2019-104938, filed 5 Jun. 2019, all of which are incorporated herein by reference, and priority is claimed to each of the foregoing.

TECHNICAL FIELD

The present disclosure relates to a flow rate controller, a gas supply system, and a flow rate control method.

BACKGROUND

Conventionally, a processing device for processing a target object such as a semiconductor wafer or the like with plasma of a processing gas has been known. A flow rate of a gas supplied to the processing device is controlled by a flow rate controller.

The flow rate controller has, e.g., a control valve having a variable opening degree and capable of controlling a gas flow rate. The flow rate controller opens the control valve to start the control of the gas flow rate when the processing device has issued a command that instructs the start of supplying gas. The command issued by the processing device includes information for specifying a target flow rate and a target supply time of a gas to be supplied to the processing device. The flow rate controller controls the opening degree of the control valve such that the gas flow rate reaches the target flow rate specified by the command by the time the target supply time specified by the command issued by the processing device is reached. Then, the flow rate controller closes the control valve to stop the control of the gas flow rate when the target supply time has elapsed.

Patent Document 1: Japanese Patent Application Publication No. 2009-157578

The present disclosure provides a technique capable of realizing highly accurate flow rate control.

SUMMARY

In accordance with an aspect of the present disclosure, there is provided a flow rate controller including: a valve configured to control a flow rate of a gas supplied to a processing device; and a valve control unit configured to open the valve to start a control of the flow rate of the gas when the processing device has issued a command that instructs a start of supplying gas; calculate a cumulative flow amount by integrating the flow rate of the gas at every predetermined cycle from a time point at which the command is issued; and close the valve to stop the control of the flow rate of the gas at a time point at which the calculated cumulative flow amount has reached a predetermined target cumulative flow amount.

Effect

In accordance with the present disclosure, highly accurate flow rate control can be realized.

DETAILED DESCRIPTION

Hereinafter, various embodiments will be described in detail with reference to the accompanying drawings. Like reference numerals will be given to like or corresponding parts throughout the drawings.

Conventionally, a processing device for processing a target object such as a semiconductor wafer or the like with plasma of a gas or the like has been known. A flow rate of a gas supplied to the processing device is controlled by a flow rate controller.

The flow rate controller has, e.g., a control valve having a variable opening degree and capable of controlling a gas flow rate. The flow rate controller opens the control valve to start the control of the gas flow rate when the processing device has issued a command that instructs the start of supplying gas. The command issued by the processing device includes information for specifying a target flow rate and a target supply time of a gas to be supplied to the processing device. The flow rate controller controls the opening degree of the control valve such that the gas flow rate reaches the target flow rate specified by the command by the time the target supply time specified by the command issued by the processing device is reached. Then, the flow rate controller closes the control valve to stop the control of the gas flow rate when the target supply time has elapsed.

Since there are device differences between the flow rate controllers, the respective flow rate controllers may have different characteristics in increasing the gas flow rate from the opening of the control valve until the gas flow rate reaches the target flow rate. For example, overshooting or undershooting of the gas flow rate may occur in each flow rate controller. Thus, in the flow rate controllers, the cumulative flow amount of the gas supplied to the processing device may be different from each other due to the different characteristics in increasing the gas flow rate of the respective flow rate controllers. Accordingly, highly accurate flow rate control may be hindered.

First Embodiment

<Overall Configuration of the Processing System>

Figure 1:
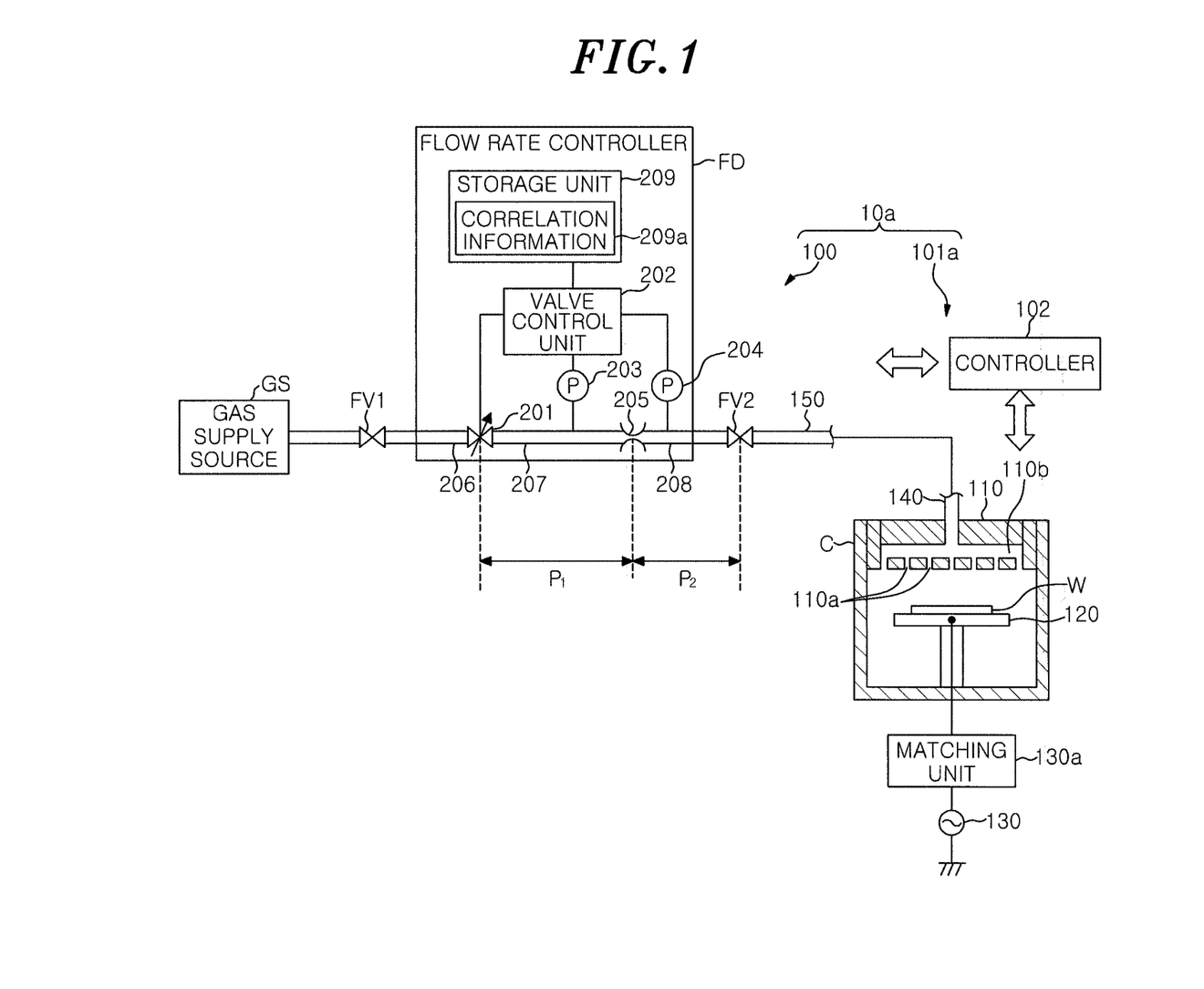
FIG. 1 shows an example of a processing system according to a first embodiment.

First, an example of an overall configuration of a processing system 10a according to a first embodiment will be described with reference to FIG. 1. FIG. 1 shows an example of the processing system 10a according to the first embodiment. The processing system 10a includes a gas supply system 100 and a processing device 101a. The gas supply system 100 includes a flow rate controller FD, a primary valve FV1, and a secondary valve FV2, and is configured to control a supply of a gas from a gas supply source GS to the processing device 101a. The processing device 101a is, e.g., a capacitively coupled plasma etching apparatus.

<Configuration Example of the Processing Device 101a>

The processing device 101a has, e.g., a substantially cylindrical chamber C made of aluminum having an alumite-treated (anodically oxidized) surface. The chamber C is frame-grounded. A substrate support 120 is disposed inside the chamber C. A semiconductor wafer W that is an example of a target object is placed on the substrate support 120.

A radio frequency (RF) power supply 130 for exciting plasma is connected to the substrate support 120 through a matching unit 130a. The RF power supply 130 applies an RF power having a frequency, e.g., 60 MHz, suitable for generating plasma in the chamber C to the substrate support 120. The substrate support 120 for placing thereon the semiconductor wafer W also serves as a lower electrode. The matching unit 130a is configured to match a load impedance to an internal (or output) impedance of the RF power supply 130. The matching unit 130a functions such that the load impedance and the internal impedance of the RF power supply 130 apparently match when the plasma is generated in the chamber C.

A shower head 110 is disposed at a ceiling portion of the chamber C. The shower head 110 also serves as an upper electrode. The RF power from the RF power supply 130 is applied to a space between the substrate support 120 and the shower head 110. A gas is introduced from a gas inlet port 140 of the shower head 110 into a buffer space 110b in the shower head 110 and, then, is injected into the chamber C through multiple gas injection holes 110a formed in the bottom surface of the shower head 110.

The processing device 101a performs microprocessing on the semiconductor wafer W with plasma of a desired gas supplied into the chamber C. The flow rate of the gas supplied into the chamber C is controlled by the flow rate controller FD. In the present embodiment, the flow rate controller FD is, e.g., a pressure-type flow rate controller FCS. The configuration of the flow rate controller FD will be described in detail later.

The operation of the processing device 101a is integrally controlled by a controller 102. The controller 102 includes, e.g., a central processing unit (CPU) and is configured to control the individual components of the processing device 101a. Further, the controller 102 issues a command that instructs the start of supplying gas (hereinafter referred to as "supply start command") to the gas supply system 100 at the time of starting the supply of a gas from the gas supply source GS to the processing device 101a. The supply start command includes information for specifying a target flow rate and a target supply time of a gas to be supplied to the processing device 101a (chamber C).

<Configuration Example of Flow Rate Controller FD>

The flow rate controller FD is connected to a gas supply line 150 through which a gas is supplied from the gas supply source GS to the processing device 101a. The gas supply line 150 is connected to the gas inlet port 140 of the processing device 101a. The primary valve FV1 is disposed at the upstream side (gas supply source GS side) of the flow rate controller FD, and the secondary valve FV2 is disposed at the downstream side (processing device 101a side) of the flow rate controller FD. The primary valve FV1 and the secondary valve FV2 are controlled to be fully opened when the controller 102 has issued the supply start command.

The flow rate controller FD includes a control valve 201 having a variable opening degree and capable of controlling a gas flow rate, a valve control unit 202 for controlling the opening degree of the control valve 201, pressure gauges 203 and 204, an orifice 205, pipes 206 to 208, and a storage unit 209. The storage unit 209 is configured to store control programs and various data for realizing various processes executed by the flow rate controller FD under the control of the valve control unit 202. For example, the storage unit 209 stores correlation information 209a.

The correlation information 209a is data that stores the relationship of a target cumulative flow amount with respect to a target flow rate and a target supply time of a gas to be supplied to the processing device 101a (chamber C). The target flow rate and target supply time of the gas to be supplied to the chamber C are specified by, e.g., a recipe. The target cumulative flow amount is a target value of a cumulative flow amount of the gas that is actually supplied to the chamber C from a time point at which the supply start command is issued by the controller 102. Further, the target cumulative flow amount is an index for determining the timing for closing the control valve 201. The correlation information 209a is, e.g., information of an equation for calculating the target cumulative flow amount from the target flow rate and the target supply time of the gas to be supplied to the chamber C. The correlation information 209a may be a table in which the target cumulative flow amount is associated with the target flow rate and the target supply time of the gas to be supplied to the chamber C.

The valve control unit 202 includes, e.g., a CPU, and is configured to control the individual components such as the control valve 201 and the like by reading out and executing the control program stored in the storage unit 209. For example, the valve control unit 202 controls the flow rate of the gas supplied into the chamber C through the gas supply line 150 by controlling the opening degree of the control valve 201. The control valve 201 may be, e.g., a solenoid valve drive type metal diaphragm valve.

The upstream side of the primary valve FV1 is connected to the gas supply source GS through a pipe. The downstream side of the primary valve FV1 is connected to the pipe 206. The downstream side of the pipe 206 is connected to the upstream side of the control valve 201. The downstream side of the control valve 201 is connected to the upstream side of the pipe 207. The downstream side of the pipe 207 is connected to the upstream side of the pipe 208 through the orifice 205. The downstream side of the pipe 208 is connected to the upstream side of the secondary valve FV2. The downstream side of the secondary valve FV2 is connected to the gas supply line 150.

Here, the pressure in the flow path of the pipe 207 is defined as $P_1$, and the pressure in the flow path of the pipe 208 is defined as $P_2$. In the flow rate controller FD, when the pressure $P_1$ in the flow path of the pipe 207 and the pressure $P_2$ in the flow path of the pipe 208 are controlled to substantially satisfy a critical expansion pressure condition of "$P_1 > 2 \times P_2$," a flow rate Q of the gas flowing through the orifice 205 is expressed by the following equation (1). In other words, the flow rate Q of the gas flowing through the orifice 205 is determined only by the pressure $P_1$ at the upstream side of the orifice 205.

$$Q = CP_1 \qquad \text{Eq. (1)}$$

The valve control unit 202 opens the control valve 201 to start the control of the gas flow rate based on the equation (1) when the controller 102 has issued the supply start command. Specifically, the valve control unit 202 controls the opening degree of the control valve 201 based on the equation (1) to adjust the pressure $P_1$ such that the flow rate Q of the gas at the downstream side of the orifice 205 varies to reach the target flow rate specified by the supply start command. Accordingly, the gas is supplied to the processing device 101a (chamber C) at the flow rate Q while varying.

"C" denoted in the equation (1) is a constant determined by a diameter of the orifice 205, a temperature of a gas, or the like. The pressures $P_1$ and $P_2$ are measured by the pressure gauges 203 and 204, respectively.

Then, the valve control unit 202 calculates a cumulative flow amount by integrating the flow rate Q of the gas at every predetermined cycle from a time point at which the supply start command is issued.

Then, the valve control unit 202 closes the control valve 201 to stop the control of the gas flow rate based on the equation (1) when the calculated cumulative flow amount has reached a predetermined target cumulative flow amount. Specifically, the valve control unit 202 monitors, based on the correlation information 209a, whether or not the cumulative flow amount has reached the target cumulative flow amount corresponding to the target flow rate with the target supply time specified by the supply start command. When the cumulative flow amount has not reached the target cumulative flow amount, the valve control unit 202 continues the control of the gas flow rate controlled based on the equation (1). When the cumulative flow amount has reached the target cumulative flow amount, the valve control unit 202 closes the control valve 201 to stop the control of the gas flow rate controlled based on the equation (1).

With the above configuration, even when the flow rate controllers FD have different characteristics in increasing the gas flow rate, it becomes possible to make the cumulative flow amount of the gas supplied to the processing device 101a the same as the target cumulative flow amount. Thus, highly accurate control of the flow rate can be achieved.

In the case of performing a treatment such as etching or the like in the processing device 101a configured as described above, first, the semiconductor wafer W is loaded into the chamber C and placed on the substrate support 120. Then, the pressure in the chamber C is reduced to a vacuum state. Next, the gas outputted from the gas supply source GS is introduced into the chamber C from the shower head 110 in a shower-like manner. Then, a predetermined RF power outputted from the RF power supply 130 is applied to the substrate support 120.

The treatment such as plasma etching is performed on the semiconductor wafer W placed on the substrate support 120 by the activation of the plasma generated by ionizing and dissociating the gas introduced into the chamber C with the RF power. After the treatment such as plasma etching is completed, the semiconductor wafer W is unloaded from the chamber C to the outside. Here, in the processing device 101a, the treatment using plasma is not necessarily performed, and microprocessing on the semiconductor wafer W by heat treatment or the like may be performed.

<Flow Rate Control Method>

Figure 2A:
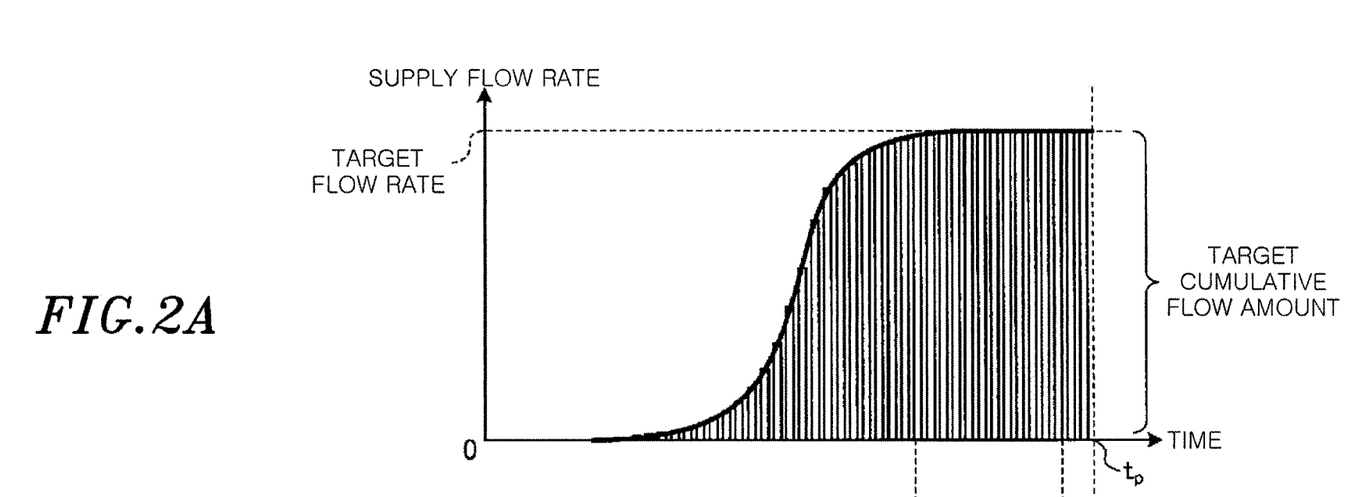
FIGS. 2A and 2B show an example of a flow rate control method according to the first embodiment.
Figure 2B:
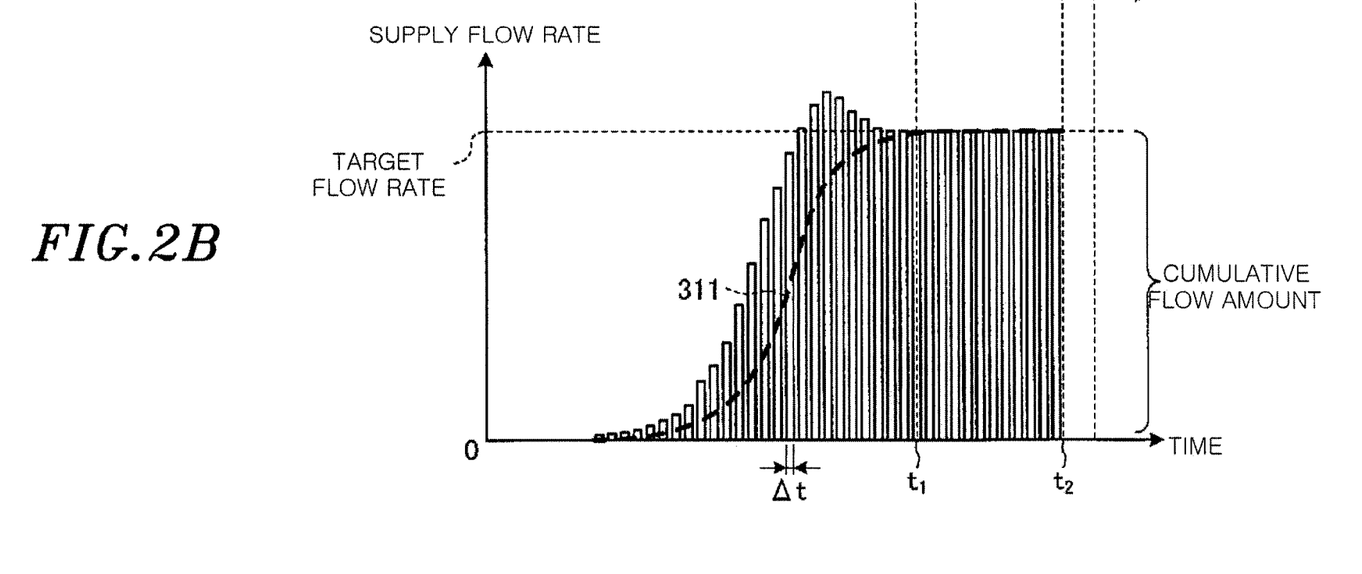

Next, a flow rate control method using the flow rate controller FD according to the first embodiment will be described. FIGS. 2A and 2B show an example of the flow rate control method according to the first embodiment.

In FIGS. 2A and 2B, the horizontal axis represents time and the vertical axis represents a flow rate of a gas supplied to the processing device 101a (chamber C) (i.e., a flow rate Q of a gas at the downstream side of the orifice 205). Hereinafter, for the sake of convenience of description, the flow rate of the gas supplied to the processing device 101a (chamber C) may be referred to as "supply flow rate." Further, in FIGS. 2A and 2B, a time point 0 indicates a time point at which the processing device 101a (controller 102) has issued the supply start command. Further, a time point $t_p$ indicates a time point at which a target supply time specified by the supply start command is reached.

FIG. 2A shows a target cumulative flow amount corresponding to a target flow rate with a target supply time specified by the supply start command. The target cumulative flow amount is obtained in advance by integrating the flow rate of the gas that is actually supplied to the processing device 101a (chamber C) from the time point 0 to the time point $t_p$ in a specific flow controller FD. The specific flow rate controller FD is, e.g., a flow rate controller FD prepared to meet the specific standards. Then, the relationship of the target cumulative flow amount with respect to the target flow rate and target supply time is stored in advance in the correlation information 209a. Further, FIG. 2A shows a change of the supply flow rate and the target cumulative flow amount at the target supply time for the specific flow controller FD, and, in FIG. 2B, the change of the supply flow rate shown in FIG. 2A is indicated by a dashed waveform 311.

As shown in FIG. 2B, the valve control unit 202 opens the control valve 201 to start the control of the gas flow rate based on the equation (1) at the time point 0 when the controller 102 has issued the supply start command. Here, overshooting of the supply flow rate occurs. That is, the overshooting in which the supply flow rate exceeds the supply flow rate (see the waveform 311) shown in FIG. 2A occurs in a period from the time point 0 at which the control valve 201 is opened to the time point $t_1$ at which the supply flow rate reaches the target flow rate specified by the supply start command.

Then, the valve control unit 202 calculates the cumulative flow amount by integrating the supply flow rate (the flow rate Q of the gas at the downstream side of the orifice 205) at every predetermined cycle $\Delta t$ from the time point 0 at which the supply start command is issued. The predetermined cycle $\Delta t$ is shorter than every cycle at which the controller 102 issues the supply start command, and is 1 millisecond for example.

Then, the valve control unit 202 monitors, based on the correlation information 209a, whether or not the cumulative flow amount has reached the target cumulative flow amount corresponding to the target flow rate and the target supply time specified by the supply start command (i.e., the target cumulative flow amount shown in FIG. 2A). In FIG. 2B, it is assumed that the cumulative flow amount reaches the target cumulative flow amount at a time point $t_2$. The valve control unit 202 closes the control valve 201 to stop the control of the gas flow rate based on the equation (1) at the time point $t_2$ at which the cumulative flow amount has reached the target cumulative flow amount.

Here, in the flow rate controller FD, as described above, overshooting of the supply flow rate occurs in the period from the time point 0 at which the control valve 201 is opened until the time point $t_1$ at which the supply flow rate reaches the target flow rate specified by the supply start command. Therefore, if the control of the gas flow rate based on the equation (1) is continued until the time point $t_p$ at which the target supply time specified by the supply start command is reached, the cumulative flow amount exceeds the target cumulative flow amount by the amount corresponding to the overshooting of the supply flow rate.

Therefore, the valve control unit 202 closes the control valve 201 to stop the control of the gas flow rate based on the equation (1) at the time point $t_2$ when the cumulative flow amount has reached the target cumulative flow amount before the target supply time specified by the supply start command is reached.

Accordingly, even when the flow rate controllers FD have different characteristics in increasing the gas flow rate, it becomes possible to make the cumulative flow amount of the gas supplied to the processing device 101a the same as the target cumulative flow amount. Thus, highly accurate control of the flow rate can be achieved.

Figure 3A:
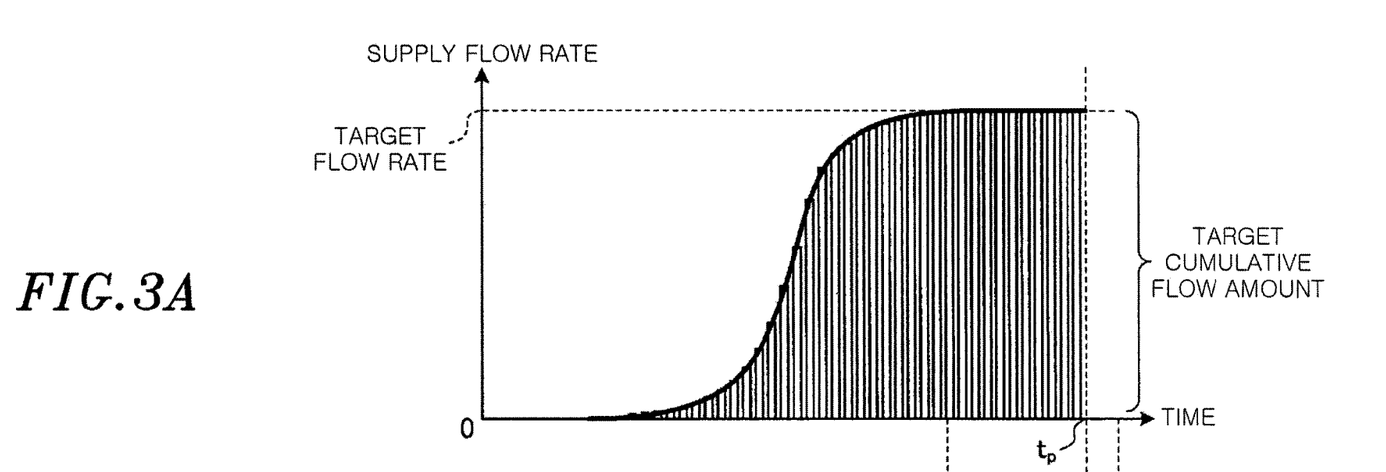
FIGS. 3A and 3B show another example of the flow rate control method according to the first embodiment.
Figure 3B:
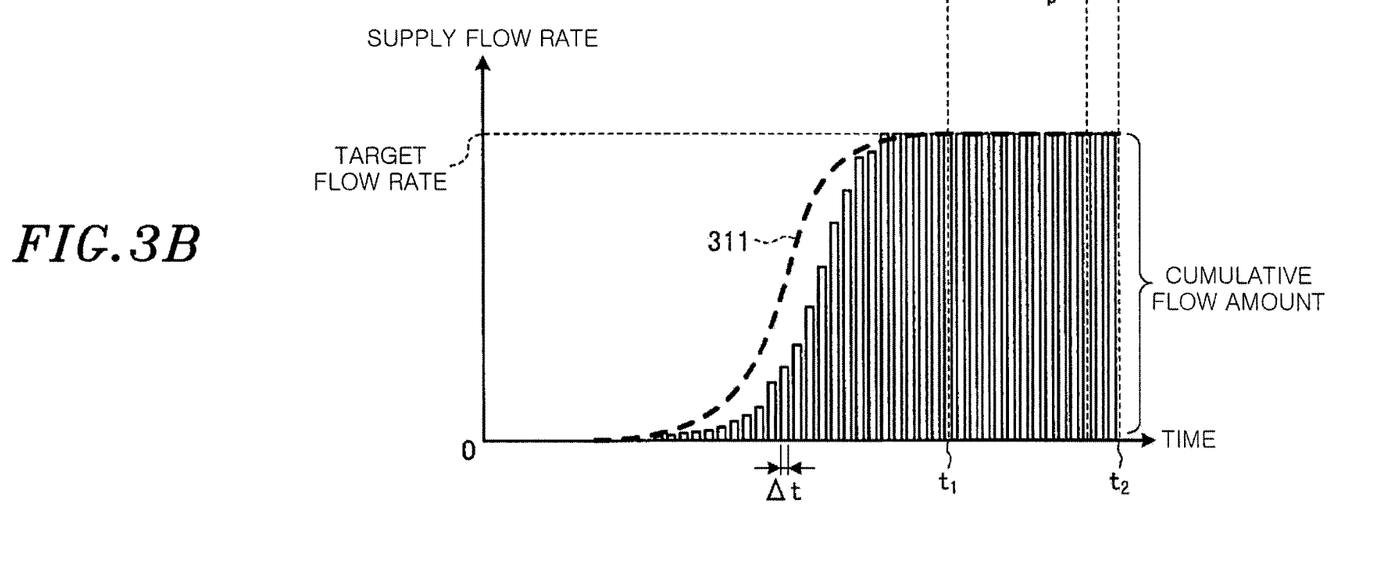

FIGS. 3A and 3B shows another example of the flow rate control method according to the first embodiment.

In FIGS. 3A and 3B, the horizontal axis represents time and the vertical axis represents a flow rate of a gas supplied to the processing device 101a (chamber C) (i.e., a flow rate Q of a gas at the downstream side of the orifice 205). Hereinafter, for the sake of convenience of description, the flow rate of the gas supplied to the processing device 101a (chamber C) may be referred to as "supply flow rate." Further, in FIGS. 3A and 3B, a time point 0 indicates a time point at which the processing device 101a (controller 102) issues the supply start command. Further, a time point $t_p$ indicates a time point at which a target supply time specified by the supply start command is reached.

FIG. 3A shows a target cumulative flow amount corresponding to a target flow rate with a target supply time specified by the supply start command. The target cumulative flow amount is obtained in advance by integrating the flow rate of the gas that is actually supplied to the processing device 101a (chamber C) from the time point 0 to the time point $t_p$ in a specific flow controller FD. The specific flow rate controller FD is, e.g., a flow rate controller FD configured to meet the specific standards. Then, the relationship of the target cumulative flow amount with respect to the target flow rate and target supply time is stored in advance in the correlation information 209a. Further, FIG. 3A shows a change of the supply flow rate and the target cumulative flow amount at the target supply time for the specific flow controller FD, and, in FIG. 3B, the change of the supply flow rate shown in FIG. 3A is indicated by a dashed waveform 311.

As shown in FIG. 3B, the valve control unit 202 opens the control valve 201 to start the control of the gas flow rate based on the equation (1) at the time point 0 when the controller 102 has issued the supply start command. Here, undershooting of the supply flow rate occurs. That is, the undershooting in which the supply flow rate is lower than the supply flow rate (see the waveform 311) shown in FIG. 3A occurs in a period from the time point 0 at which the control valve 201 is opened to the time point $t_1$ at which the supply flow rate reaches the target flow rate specified by the supply start command.

Then, the valve control unit 202 calculates the cumulative flow amount by integrating the supply flow rate (the flow rate Q of the gas at the downstream side of the orifice 205) at every predetermined cycle Δt from the time point 0 at which the supply start command is issued. The predetermined cycle Δt is shorter than a cycle at which the supply start command is issued by the controller 102, and is 1 millisecond for example.

Then, the valve control unit 202 monitors, based on the correlation information 209a, whether or not the cumulative flow amount has reached the target cumulative flow amount corresponding to the target flow rate and the target supply time specified by the supply start command (i.e., the target cumulative flow amount shown in FIG. 3A). In FIG. 3B, it is assumed that the cumulative flow amount reaches the target cumulative flow amount at a time point $t_2$. The valve control unit 202 closes the control valve 201 to stop the control of the gas flow rate based on the equation (1) at the time point $t_2$ at which the cumulative flow amount has reached the target cumulative flow amount.

Here, in the flow rate controller FD, as described above, undershooting of the supply flow rate occurs in the period from the time point 0 at which the control valve 201 is opened until the time point $t_1$ at which the supply flow rate reaches the target flow rate specified by the supply start command. Therefore, if the control of the gas flow rate based on the equation (1) is continued until the time point $t_p$ at which the target supply time specified by the supply start command is reached, the cumulative flow amount becomes lower than the target cumulative flow amount by the amount corresponding to the undershooting of the supply flow rate.

Therefore, the valve control unit 202 closes the control valve 201 to stop the control of the gas flow rate based on the equation (1) at the time point $t_2$ when the cumulative flow amount has reached the target cumulative flow amount after the target supply time specified by the supply start command is reached.

Accordingly, even when the flow rate controllers FD have different characteristics in increasing the gas flow rate, it becomes possible to make the cumulative flow amount of the gas supplied to the processing device 101a the same as the target cumulative flow amount. Thus, highly accurate control of the flow rate can be achieved.

As described above, the flow rate controller FD according to the first embodiment has the control valve 201 and the valve control unit 202. The control valve 201 is configured to control the flow rate of the gas supplied to the processing device 101a. The valve control unit 202 is configured to open the control valve 201 to start the control of the gas flow rate when the processing device 101a has issued the command that instructs the start of supplying gas, and calculates the cumulative flow amount by integrating the gas flow rate at every predetermined cycle from a time point at which the command is issued. The valve control unit 202 is further configured to close the control valve 201 to stop the control of the gas flow rate at the time point at which the calculated cumulative flow amount has reached a predetermined target cumulative flow amount. Accordingly, even when the flow rate controllers FD have different characteristics in increasing the gas flow rate, it becomes possible to make the cumulative flow amount of the gas supplied to the processing device 101a the same as the target cumulative flow amount. Thus, highly accurate control of the flow rate can be achieved.

Second Embodiment

Figure 4:
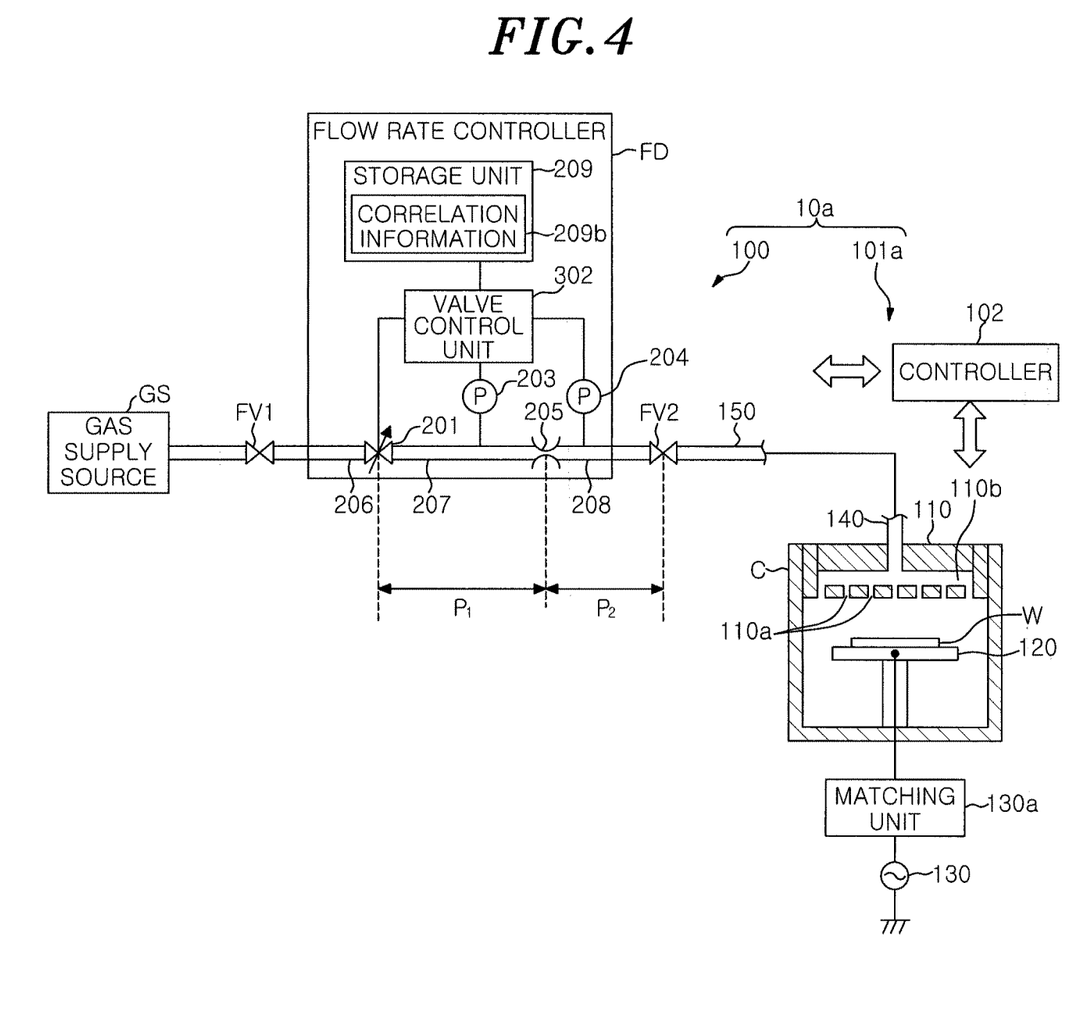
FIG. 4 shows an example of a processing system according to a second embodiment.

Next, a second embodiment will be described. FIG. 4 shows an example of a processing system 10a according to the second embodiment. Since the processing system 10a according to the second embodiment has substantially the same configuration as that of the processing system 10a according to the first embodiment shown in FIG. 1, like reference numerals will be given to like parts and the differences will be mainly described.

In the second embodiment, the flow rate controller FD includes a valve control unit 302 instead of the valve control unit 202 shown in FIG. 1. Further, the storage unit 209 stores correlation information 209b.

The correlation information 209a is data that stores the relationship of a target cumulative flow amount with respect to a target flow rate and a target supply time of a gas to be supplied to the processing device 101a (chamber C). The target flow rate and target supply time of the gas to be supplied to the chamber C are specified by, e.g., a recipe. The target cumulative flow amount is a target value of a cumulative flow amount of the gas that is actually supplied to the chamber C from when the controller 102 has issued the supply start command. In the present embodiment, the target cumulative flow amount is preset for each elapsed time from when the controller 102 has issued the supply start command.

The valve control unit 302 is configured to control the flow rate of the gas supplied into the chamber C through the gas supply line 150 by controlling the opening degree of the control valve 201. The valve control unit 302 opens the control valve 201 to start the control of the gas flow rate based on the equation (1) when the controller 102 has issued the supply start command. Specifically, the valve control unit 302 controls the opening degree of the control valve 201 based on the equation (1) to adjust the pressure $P_1$ such that the flow rate Q of the gas at the downstream side of the orifice 205 varies to reach the target flow rate specified by the supply start command. Accordingly, the gas is supplied to the processing device 101a (chamber C) at the flow rate Q while varying.

Then, the valve control unit 302 determines, based on a difference between a predetermined target cumulative flow amount and a cumulative flow amount obtained by integrating the flow rate Q of the gas at every predetermined cycle, a temporal change rate of the flow rate Q that compensates the difference in a transition period that lasts until the flow rate of the gas reaches a predetermined target flow rate. The predetermined target flow rate is specified by the supply start command. The predetermined target cumulative flow amount is obtained from the correlation information 209a in association with a supply flow rate at each elapsed time for the target flow rate specified by the supply start command.

Then, the valve control unit 302 controls the opening degree of the control valve 201 such that the flow rate Q of the gas changes according to the determined temporal change rate.

With the above configuration, even when the flow rate controllers FD have different characteristics in increasing the gas flow rate, the shortage of the cumulative flow amount with respect to the target cumulative flow amount can be compensated by the temporal change of the flow rate Q of the gas. Thus, highly accurate control of the flow rate can be achieved.

Figure 5:
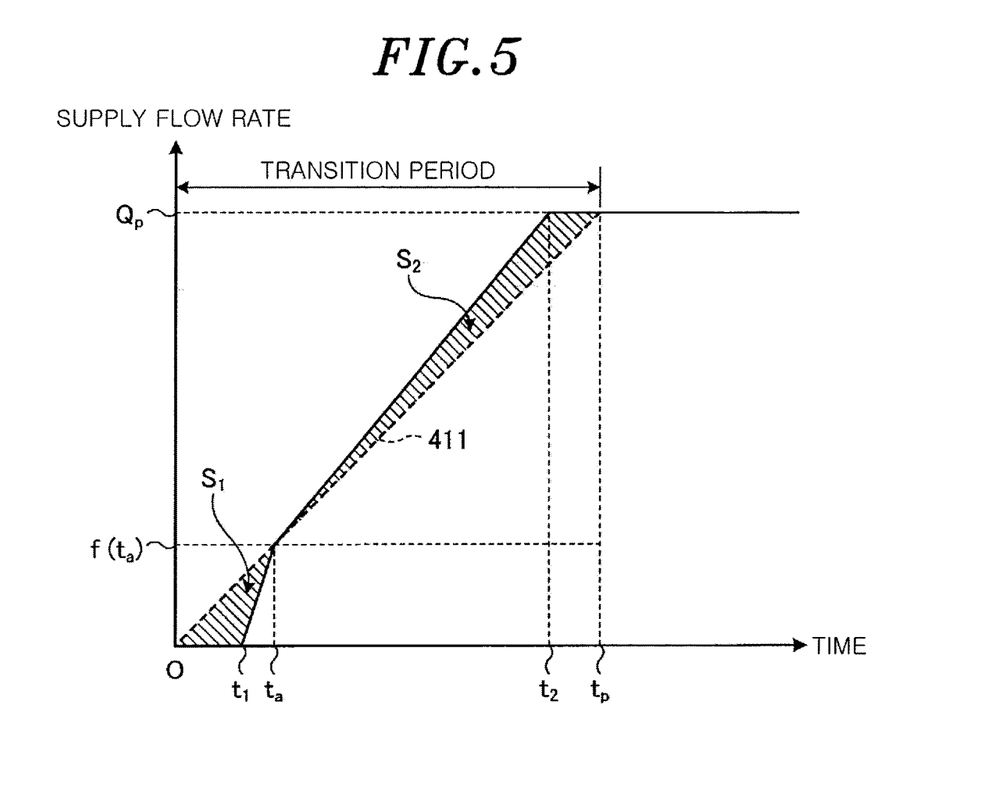
FIG. 5 shows an example of a flow rate control method according to the second embodiment.

Next, a flow rate control method using the flow rate controller FD according to the second embodiment will be described. FIG. 5 shows an example of the flow rate control method according to the second embodiment.

In FIG. 5, the horizontal axis represents time and the vertical axis represents a flow rate of a gas supplied to the processing device 101a (chamber C) (i.e., a flow rate Q of a gas at the downstream side of the orifice 205). Hereinafter, for the sake of convenience of description, the flow rate of the gas supplied to the processing device 101a (chamber C) may be referred to as "supply flow rate." Further, in FIG. 5, a time point 0 indicates a time point at which the processing device 101a (controller 102) issues the supply start command. Further, a time point $t_p$ indicates a time point at which a target supply time specified by the supply start command is reached. In FIG. 5, the target flow rate $Q_p$ specified by the supply start command is illustrated. In the present embodiment, the relationship of the target cumulative flow amount with respect to the target flow rate $Q_p$ and the target supply time is stored in advance in the correlation information 209b. The target cumulative flow amount is preset for each elapsed time from the time point 0 at which the supply start command is issued by the controller 102.

In FIG. 5, the temporal change of the supply flow rate corresponding to the target cumulative flow amount is indicated by a dashed waveform 411. The waveform 411 is represented by a linear function $f(t)=Q_p/t_p \cdot t$ using t as a parameter. The function representing the waveform 411 is not limited to a linear function and may be an arbitrary first-order lag function such as an exponential function having a time constant or the like. The waveform 411 starts to increase at the time point 0 and reaches the target flow rate $Q_p$ at the time point $t_p$. In FIG. 5, the period from the time point 0 to the time point $t_p$ is defined as a "transition period that lasts until the supply flow rate reaches a predetermined target flow rate."

As shown in FIG. 5, the valve control unit 302 opens the control valve 201 to start the control of the gas flow rate based on the equation (1) at the time point 0 when the controller 102 has issued the supply start command. Here, the supply flow rate increases at the time point $t_1$ delayed from the time point 0 by a predetermined time.

Then, the valve control unit 302 calculates a cumulative flow amount by integrating the supply flow rate (the flow rate Q of the gas at the downstream side of the orifice 205) at every predetermined cycle from the time point 0 at which the supply start command is issued.

Then, the valve control unit 302 determines, based on the difference between the cumulative flow amount and a predetermined target cumulative flow amount in the transition period, the temporal change rate of the flow rate Q of the gas that compensates the difference in the transition period. In other words, the valve control unit 302 performs a computation that allows a difference between the cumulative flow amount and the target cumulative flow amount at a certain time point $t_a$ in the transition period to be the same as an increase amount of the cumulative flow amount in a period $(t_p - t_a)$ after the time point $t_a$ in the transition period, thereby determining the temporal change rate that compensates the difference. In the example of FIG. 5, the difference between the cumulative flow amount and the target cumulative flow amount at the time point $t_0$ corresponds to a hatched area $S_1$, and the increase amount of the cumulative flow amount in the period $(t_p - t_a)$ corresponds to a hatched area $S_2$. The area $S_1$ is represented by "½·$f(t_a) \cdot t_a$−S" where S is a cumulative flow amount. The area $S_2$ is represented by "½·$(Q_p - f(t_a)) \cdot (t_p - t_2)$" where $t_2$ is a time point at which the supply flow rate reaches the target flow rate $Q_p$ on the assumption that the area $S_1$ is equal to the area $S_2$. The valve control unit 302 determines the temporal change rate of the flow rate Q of the gas that compensates the difference by performing the computation that allows the area $S_1$ to be the same as the area $S_2$. In other words, the valve control unit 302 determines the slope of the waveform of the supply flow rate in the period $(t_2 - t_a)$ of FIG. 5 as the temporal change rate of the flow rate Q of the gas by performing the computation that allows the area $S_1$ to be the same as the area $S_2$.

Then, the valve control unit 302 controls the opening degree of the control valve 201 such that the flow rate Q changes according to the determined temporal change rate.

Accordingly, even when the flow rate controllers FD have different characteristics in increasing the gas flow rate, the shortage of the cumulative flow amount with respect to the target cumulative flow amount can be compensated in the transition period that lasts until the flow rate Q reaches the predetermined target flow rate. Thus, highly accurate control of the flow rate can be achieved.

As described above, the flow rate controller FD according to the second embodiment has the control valve 201 and the valve control unit 302. The valve control unit 302 is configured to open the control valve 201 to start the control of the gas flow rate when the processing device 101a has issued the command that instructs the start of supplying gas. The valve control unit 302 determines, based on the difference between a predetermined target cumulative flow amount for every predetermined cycle and a cumulative flow amount obtained by integrating the gas flow rate at every predetermined cycle, the temporal change rate of the gas flow rate that compensates the difference in the transition period that lasts until the gas flow rate reaches the predetermined target flow rate. Then, the valve control unit 302 controls the opening degree of the control valve 201 such that the gas flow rate changes according to the determined temporal change rate. Accordingly, even when the flow rate controllers FD have the different characteristics in increasing the gas flow rate, the flow rate controller FD can compensate the shortage of the cumulative flow amount with respect to the target cumulative flow amount in the transition period that lasts until the gas flow rate reaches the predetermined target flow rate. Thus, highly accurate control of the flow rate can be achieved.

In the second embodiment, the case where the opening degree of the control valve 201 is controlled such that the gas flow rate changes according to the temporal change rate determined based on the difference between the cumulative flow amount and the predetermined target cumulative flow amount has been described as an example. However, the present disclosure is not limited thereto. For example, when the determined temporal change rate is greater than a predetermined threshold, the temporal change rate is decreased to the threshold, and the opening of the control valve 201 may be controlled such that the gas flow rate changes according to the decreased temporal change rate. Accordingly, overshooting of the gas flow rate can be suppressed.

DESCRIPTION OF REFERENCE NUMERALS

FD: flow rate controller
10*a*: processing system
100: gas supply system
101*a*: processing device
102: controller
201: control valve
202, 302: valve control unit
203: pressure gauge
204: pressure gauge
205: orifice
206: pipe
207: pipe
208: pipe
209: storage unit
209*a*, 209*b*: correlation information

The invention claimed is:

1. A flow rate controller comprising:
a valve configured to control a flow rate of a gas supplied to a processing device; and a controller configured to:
compensate for flow overshoot or undershoot during the transition period so as to bring the actual cumulative flow equal to target flow during the transition period;
open the valve to start the control of the flow rate of the gas when the processing device has issued a flow command that instructs a start of supplying gas;
determine by integrating the actual flow, cumulative flow from the start of flow command to a predetermined time point in the transition period and determine a difference between the actual cumulative flow and the target cumulative flow for the same period, and
compensate for the difference by increasing or decreasing the flow rate during the remaining part of the transition period by determining a new slope of the flow waveform to adjust the flow valve.

2. The flow rate controller of claim 1, wherein the controller controls an opening degree of the valve such that the flow rate of the gas is changed to compensate for the difference.

3. A flow rate control method comprising:
compensating for flow overshoot or undershoot during the transition period so as to bring the actual cumulative flow equal to target flow during the transition period, the compensating including
opening, via control of a controller, a valve configured to control a flow rate of a gas supplied to a processing device to start a control of the flow rate of the gas when the processing device has issued a flow command that instructs a start of supplying gas;
the controller determining, by integrating the actual flow, cumulative flow from the start of flow command to a predetermined time point in the transition period and determining a difference between the actual cumulative flow and the target cumulative flow for the same period, and
compensating for the difference by increasing or decreasing the flow rate during the remaining part of the transition period by determining a new slope of the flow waveform to adjust the flow valve.

4. The flow rate control method of claim 3, wherein the controller controlling an opening degree of the valve such that the flow rate of the gas is changed to compensate for the difference.

* * * * *